United States Patent [19]
Taylor et al.

[11] Patent Number: 6,157,206
[45] Date of Patent: Dec. 5, 2000

[54] ON-CHIP TERMINATION

[75] Inventors: Gregory F. Taylor, Portland; Jack A. Price, Beaverton; Chee How Lim, Hillsboro, all of Oreg.

[73] Assignee: Intel Corporation, Santa Clara, Calif.

[21] Appl. No.: 09/224,369

[22] Filed: Dec. 31, 1998

[51] Int. Cl.$^7$ ...................... H03K 17/16; H03K 19/0185
[52] U.S. Cl. .................. 326/30; 326/34; 326/86
[58] Field of Search ................ 326/30, 82–83, 326/86, 31–34, 90

[56] References Cited

U.S. PATENT DOCUMENTS

| | | | |
|---|---|---|---|
| 4,691,127 | 9/1987 | Huizer | 326/82 |
| 5,023,488 | 6/1991 | Gunning | 326/30 |
| 5,194,765 | 3/1993 | Dunlop et al. | |
| 5,254,883 | 10/1993 | Horowitz et al. | 326/30 |
| 5,510,727 | 4/1996 | Culmer et al. | 326/30 |
| 5,559,448 | 9/1996 | Koenig | 326/30 |
| 5,585,741 | 12/1996 | Jordan | 326/30 |
| 5,821,768 | 10/1998 | Rau | 326/30 |
| 5,926,031 | 7/1999 | Wallace et al. | 326/30 |

*Primary Examiner*—Jon Santamauro
*Attorney, Agent, or Firm*—Raymond J. Werner

[57] ABSTRACT

Integrated circuits include an impedance control circuit having at least one output terminal coupled to an on-chip reference termination device in order to control output impedance of the reference termination device such that it matches that of an external resistance. The impedance control circuit outputs are also coupled to the on-chip impedance-controlled termination devices which are coupled to each of the external transmission lines to be terminated. In this way, a single reference resistance allows many transmission lines to be properly terminated. The impedance-controlled termination devices are may be implemented as pairs of binary weighted p-channel and n-channel field effect transistors.

20 Claims, 3 Drawing Sheets

ON-CHIP TERMINATION

BACKGROUND OF THE INVENTION

1. Field of the Invention

The present invention relates generally to integrated circuits, and more particularly to integrated, impedance matching, termination circuits.

2. Background

Advances in semiconductor manufacturing technologies have allowed circuit designers to integrate tremendous numbers of transistors on a single die. For example, modern integrated circuits (ICs) commonly include several million transistors interconnected on a single, small substrate. Typically, these are field effect transistors (FET). At the same time, computer architecture, and more particularly processor architecture, has gone in the direction of emphasizing shorter and shorter cycle times. These advances in semiconductor manufacturing and processor architecture have led to the production of very high-speed integrated circuits.

Many electronic systems, including but not limited to computer systems, are made up of a number of integrated circuits, each of which operates at high speed. The various integrated circuits are typically electrically interconnected by means of one or more buses. These buses are typically collections of physical interconnection signal lines that provide communication pathways between and among the various integrated circuits. As is known in this field, the signals that are transferred over the buses between the integrated circuits may represent such things as data, instructions, or control information. In order to obtain the most benefit from the high-speed operational capabilities of these integrated circuits, it is generally desirable to communicate over the buses at a high data transfer rate.

Various techniques have been developed for facilitating high-speed electrical communication over buses. For example, reducing the voltage swing that is required to distinguish between a logical one and a logical zero, also reduces the amount of time that is required for a signal transition and therefore provides for faster operation. Another technique that is useful for enabling high-speed communication over buses is the use of termination devices. Proper termination of signal lines reduces or eliminates the problems caused by signal reflections. Typically, a termination device is implemented as a resistor that is coupled between a signal line and a power supply node.

What is needed are circuits and methods for providing low-cost, area-efficient, impedance-matched termination for transmission lines.

SUMMARY OF THE INVENTION

Briefly, on-chip, impedance-controlled, termination devices are provided to terminate transmission lines, and substantially reduce reflections.

In one particular embodiment of the present invention, an impedance-controlled termination device comprises a digitally controlled combination of NFETs and PFETs coupled between a power supply node and an input node, wherein the number of NFETs and PFETs that are turned on determines the impedance of the termination device.

In an alternative embodiment of the present invention, an impedance-controlled termination device comprises a p-channel field effect transistor coupled between a power supply node and an input node, and having a gate terminal coupled to a control circuit that provides an analog bias voltage to set the impedance of the termination device.

DETAILED DESCRIPTION

Illustrative embodiments of the present invention are described below. In the interest of clarity, not all aspects of an actual implementation are described in this specification. It will of course be appreciated that in the development of any such actual embodiment, numerous implementation-specific decisions must be made to achieve the developer's specific goals, such as compliance with system-related, and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Overview

Embodiments of the present invention provide circuits and methods to terminate off-chip transmission lines without requiring an external resistor on each signal line, thereby reducing the amount of wiring required, as well as reducing system cost.

Exemplary circuits in accordance with the present invention include an impedance control circuit having an output terminal coupled to a reference p-channel field effect transistor (PFET) in order to control the output impedance of the reference PFET such that it substantially matches that of a single external resistor. The impedance control circuit output terminal is also coupled to drive the gate terminals of termination PFETs coupled to each of the external transmission lines to be terminated. In this way, a single reference resistor allows many transmission lines to be properly terminated, notwithstanding process, voltage, and temperature variations on the receiver chip. It will be recognized by those skilled in the art that a field effect transistor can be viewed as a variable impedance device wherein the impedance between source and drain terminals of the transistor are a function of the voltage applied to the gate terminal.

Alternative embodiments of the invention may use combinations of NFETs and PFETs as both a reference termination device, and as an impedance-controlled signal line termination device.

By replacing external termination resistors with on-chip, impedance-controlled, termination devices, the circuit board area required for external resistors is saved. Additionally, the wiring stubs used to connect the external resistors to the receiver chip are also eliminated. Since the wiring stubs contribute to undesirable signal reflections, it is advantageous to eliminate wiring stubs.

Terminology

The terms, chip, integrated circuit, monolithic device, semiconductor device, and microelectronic device, are often used interchangeably in this field. The present invention is applicable to all the above as they are generally understood in the field.

The terms metal line, trace, wire, conductor, signal path and signaling medium are all related. The related terms listed above, are generally interchangeable, and appear in order from specific to general. Various conductive elements on printed circuit boards have been referred to as lands, vias, and plated through holes, as well as conductors.

The term "gate" is context sensitive and can be used in two ways when describing integrated circuits. As used herein, gate refers to a circuit for realizing an arbitrary logical function when used in the context of a logic gate. Gate refers to the insulated gate terminal of a three terminal FET when used in the context of transistor circuit configuration. Although a FET can be viewed as a four terminal device when the semiconductor substrate is considered, for the purpose of describing illustrative embodiments of the present invention, the FET will be described using the traditional gate-drain-source, three terminal model.

In computer systems, particularly in personal computer systems, there are a number of integrated circuits that are often required in addition to the processor to form a fully functional computer. Various memory control, bus interface, and peripheral functions are commonly included in these additional integrated circuits. Most of this additional functionality is incorporated into one or more chips that are referred to collectively as a chip set. Sometimes the integrated circuits embodying this functionality have been referred to as core logic chips, or bridge circuits, or glue logic.

In a number of modern electronic systems, buses are used to interconnect various integrated circuits. Buses typically refer to a logical collection of interconnection signal lines. Often, each of the interconnection signal lines of a bus may have more than one signal source, and/or more than one signal receiver coupled to it. In some high performance systems, such as, but not limited to, computers, buses are used to interconnect microprocessors to chip sets, or to other microprocessors. A key characteristic of such interconnections is that very high-speed operation is desired. It has become common to use Gunning Transceiver Logic (GTL) or other similar circuit configurations for drivers and receivers in systems with such high-speed operation. These open drain drivers require that the transmission lines, which connect the various integrated circuits together, be terminated through a resistor to a termination power supply node. The termination power supply node is often referred to in this field as Vtt. In operation, a typical value for Vtt is approximately 1.5 volts. Those skilled in the art and having the benefit of this disclosure will recognize that other values may be chosen for the termination power supply. The present invention is not limited to any particular value for the termination power supply.

Termination is commonly accomplished by co-locating external resistors on a board, or substrate along with the integrated circuits. In a computer system, these external termination resistors are often placed on the motherboard, or in the case of a microprocessor, such as a Pentium® II processor available from Intel Corp., of Santa Clara, Calif., on a single edge connection cartridge. One or more external resistors are used for each interconnection signal line. An external resistor coupled to an interconnection signal line of a bus generally serves two purposes. First, in operation, the external resistor provides a pull-up that drives the interconnection signal line to a predetermined voltage when none of the open-drain bus drivers are actively pulling the interconnection signal line to a low level. Second, in operation, the external resistor acts to terminate signal reflections.

When terminating a transmission line, in this case the interconnection signal lines of the buses interconnecting various integrated circuits, the value of the resistor is chosen to match the characteristic impedance of the transmission line. When a signal arrives at the end of a transmission line terminated in this way, the voltage and current waveforms that carry the signal energy are (ideally) absorbed by the termination resistor without reflection. Note that if the signal were to be reflected, then it would continue to travel up and down the transmission line, and consequently interfere with subsequent signal edges. Those skilled in the art will recognize that although impedance is a complex value including resistance and reactance, it is common to select a resistor having a particular resistance value when terminating a transmission line. As is common in this field, and as used herein, impedance-matching may refer to providing a resistance which acts to make the impedance of a load substantially equal to the internal impedance of a source of power.

Although the use of external resistors provides a termination that is well matched to the transmission line, this configuration has several disadvantages. The discrete external resistors are expensive. Furthermore, these external resistors consume valuable real estate on the board or cartridge substrate on which they are mounted. Additionally, there is a stub on the transmission line where the input buffer is connected. This stub tends to reflect some portion of the signals that are traveling on the transmission line.

In an illustrative embodiment of the present invention, termination for the transmission lines is provided for by PFETs that are integrated on-chip with the receivers that are coupled to bus lines driven by open drain drivers. In this illustrative embodiment, the bus lines are driven by GTL+ drivers. In alternative embodiments, termination for the transmission lines is provided for by impedance-controlled termination devices that include combinations of NFETs and PFETs.

Note that if there are multiple integrated circuits functioning in a system as receivers or drivers, only the devices at the far ends of the transmission lines need to incorporate terminations. Also, because the termination resistance does not need to match the transmission line perfectly, less ideal but simpler tracking circuits may be used without unduly sacrificing performance.

Circuit Configuration

Figure 1:
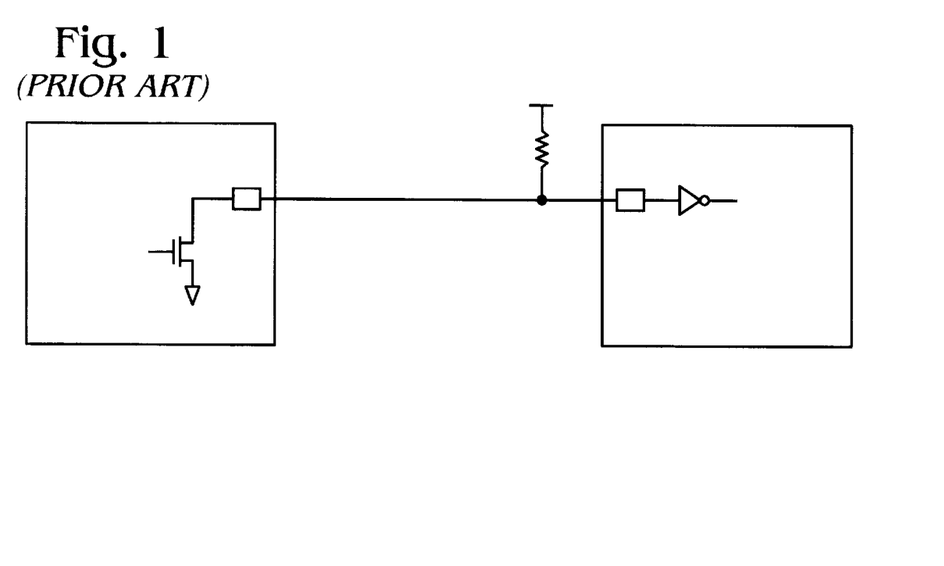
FIG. 1 is a schematic diagram illustrating a conventional arrangement of bus driver, bus receiver, and termination device.
Figure 2:
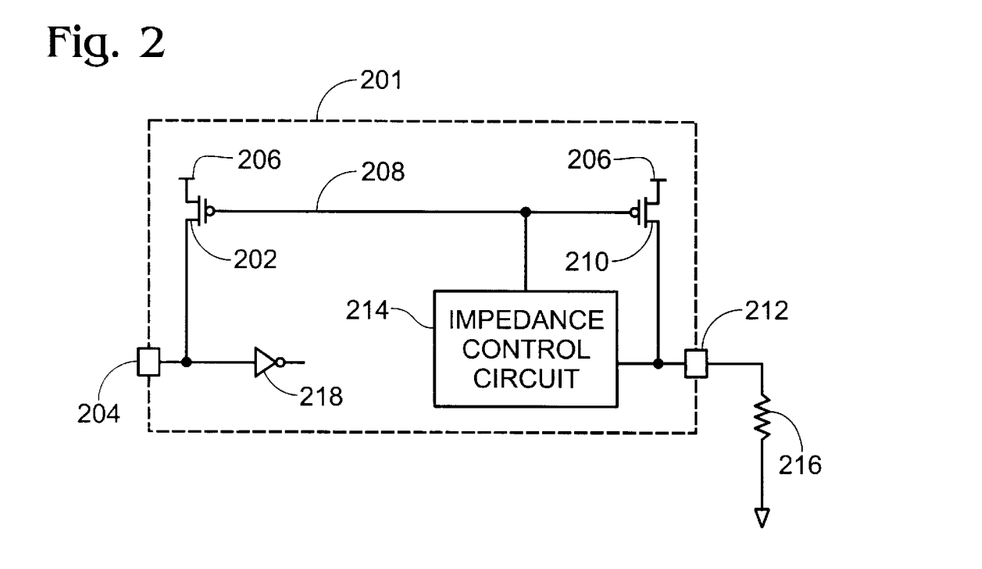
FIG. 2 is a schematic diagram illustrating an integrated circuit having an on-chip, impedance-controlled, termination device, in accordance with the present invention.

FIG. 2 shows a schematic representation of an embodiment of the present invention. In this case, a portion of an integrated circuit is shown, and more particularly a portion of an input buffer with an on-chip, impedance-controlled termination device, and an impedance control circuit with reference devices is illustrated. Those skilled in the art, and having the benefit of this disclosure, will recognize that the present invention is not limited by the functionality of any particular integrated circuit. That is, the on-chip, impedance-controlled termination devices of the present invention may be implemented on integrated circuits that function as microprocessors, chip sets, memories, graphics controllers, or any other type of integrated circuit that may be coupled to a high speed bus. Similarly, it will be recognized that although one termination device is illustrated to explain the invention, a plurality of termination devices may all have their impedance controlled by a single impedance control circuit. That is, a single external reference resistor may be used to substantially set the impedance of a plurality of termination devices.

As referred to herein, an impedance control circuit is a feedback loop that controls the impedance of a reference on-chip driver by operating the reference on-chip driver in conjunction with an off-chip resistor. In one implementation, the impedance-controlled on-chip driver is implemented as a field effect transistor. In alternative implementations the impedance-controlled on-chip driver is implemented as a combination of NFETs and PFETs, wherein the number of NFET/PFET pairs that are turned on determines the impedance of the driver. Generally, the reference on-chip driver is electrically coupled in series to an external, precision resistor, thereby forming a voltage divider with the resistor. The strength of the driver, (e.g., the on-resistance of a field effect transistor, or the effective on-resistance of a plurality of field effect transistors, or the number of field effect transistors that are turned on) is controlled in order to drive the voltage generated by the voltage divider to be substantially one half of the power supply voltage. Under these conditions the impedance of the on-chip driver and the reference resistor will be substantially equal.

Substantially identical copies of the on-chip driver are used as impedance-controlled drivers (i.e., termination devices) that are operated so as to substantially match the external resistor. In one implementation, a field effect transistor is configured to receive a voltage at its respective gate terminal that is substantially the same voltage as that applied to the gate terminal of the reference on-chip driver. In such an embodiment other parameters, such as power supply voltage and substrate voltage are also maintained at values substantially identical to those used in connection with the reference on-chip driver. In an alternative implementation, discussed more fully below, a plurality of NFETs and PFETs are used in combination to form both the reference device and the termination devices. In such an implementation, the gates of the FETs typically receive digital control signals rather than an analog bias voltage.

As shown in FIG. 2, an integrated circuit includes a first PFET 202 coupled source-to-drain between a power supply node 206 and an input node 204. Input node 204 is adapted for coupling to an interconnection signal line such as a bus line.

An input buffer circuit 218 has an input terminal coupled to input node 204. Those skilled in the art, and having the benefit of this disclosure, will recognize that there are many input buffer circuit configurations suitable for both receiving signals from a bus line, and coupling to an on-chip, impedance-controlled termination device. Any suitable input buffer circuit configuration may be used in conjunction with termination devices in accordance with the present invention. The input buffer may be as simple as a logic gate, or may be very complex and include level shifters, latches, differential amplifiers, and/or multiple stages of buffering. The present invention is not limited to any particular input buffer configuration.

Still referring to FIG. 2, a second PFET 210 is coupled source-to-drain between power supply node 206 and a node 212. Node 212 is also coupled to an input terminal of an impedance control circuit 214. A resistor 216 is coupled between node 212 and ground. Resistor 216 is typically external to the integrated circuit. In the illustrative embodiment resistor 216 is a 50 ohm resistor with a precision of +/−1%, but the invention is not limited to any particular value of resistance. The gate terminals of PFETs 202 and 210 are coupled in common to a node 208. An output terminal of impedance control circuit 214 is also coupled to node 208.

PFET 210 together with resistor 216 and impedance control circuit 214 are used in operation to produce a bias voltage at node 208. The bias voltage at node 208 determines the effective impedance of the path between input node 204 and power supply node 206.

Figure 3:
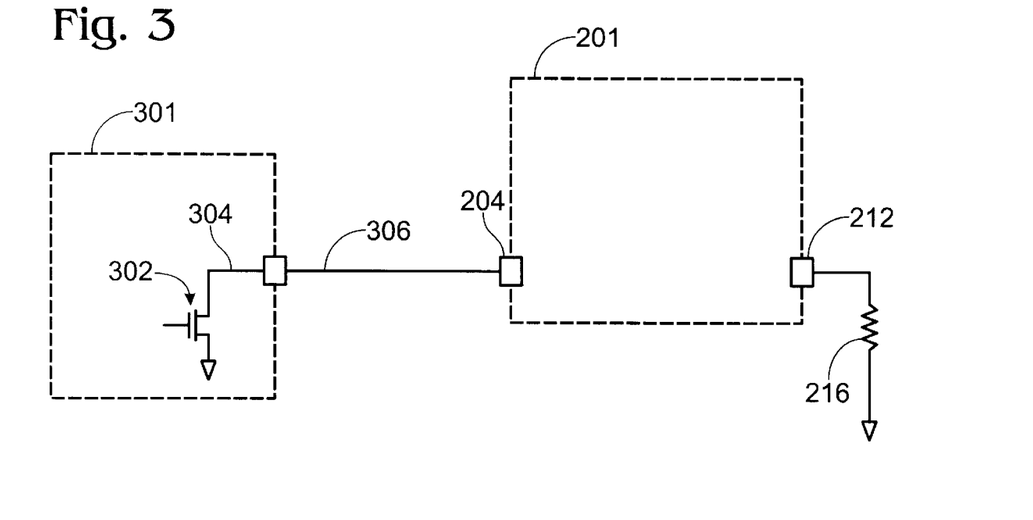
FIG. 3 is a schematic diagram illustrating a system, in accordance with the present invention, having a first integrated circuit with a bus driver, a second integrated circuit having an on-chip, impedance-controlled termination device, and a signal line coupled between the first and second integrated circuits.

FIG. 3 illustrates a system, in accordance with the present invention, having, a first integrated circuit with an on-chip, impedance-controlled, termination device, a second integrated circuit with a bus driver, and a signal line coupled between the first and second integrated circuits. More particularly, first integrated circuit 201 is as shown in FIG. 2. As shown in FIG. 3, second integrated circuit 301 has an open drain driver circuit. In this illustrative system, the open drain driver of integrated circuit 301 is implemented by an n-channel field effect transistor (NFET) 302. NFET 302 is coupled drain-to-source between an output node 304 and ground. A bus line 306 is coupled to output node 304 of integrated circuit 301, and is further coupled to input node 204 of integrated circuit 201. In this way, an interconnection signal line is provided between the two integrated circuits.

Figure 4:
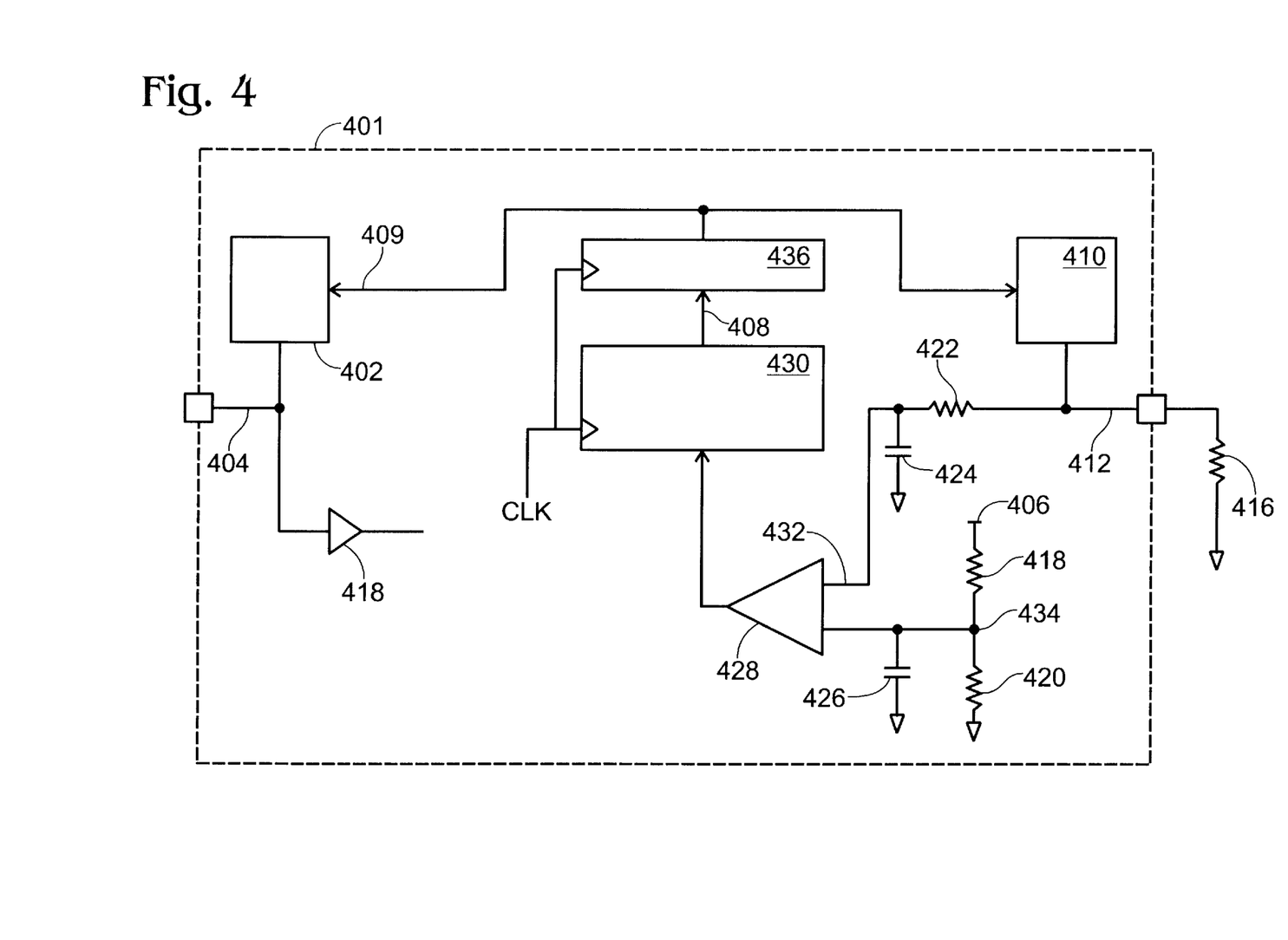
FIG. 4 is a schematic diagram illustrating an integrated circuit having an on-chip, impedance-controlled, termination device, in accordance with the present invention.

FIG. 4 shows a schematic representation of an alternative embodiment of the present invention. In this case, a portion of an integrated circuit 401 is shown, and more particularly a portion of an input buffer with an on-chip, impedance-controlled termination device, and an impedance control circuit with reference devices is illustrated. In overview, as can be seen in FIG. 4, a reference termination device is configured in series with an external precision resistor to form a voltage divider. The output node of this voltage divider is coupled to one input terminal of a comparator. The output node of a second voltage divider, fabricated on-chip, is coupled to a second input terminal of the comparator. The output of the comparator is coupled to a state machine that functions to generate control information used to reduce or increase the impedance of the reference impedance-controlled device until that impedance is substantially matched to that of the external resistor. The output of the state machine, after passing through a digital low-pass filter, sets the impedance of an impedance controlled termination device.

Still referring to FIG. 4, a reference termination device 410 is coupled to a node 412. A resistor 416 is coupled, between node 412 and ground. Resistor 416 is typically a precision resistor (e.g., +/−1%) external to integrated circuit 401. A resistor 422 is coupled between node 412 and node 432. A capacitor 424 is coupled between node 432 and ground. Resistor 422 and capacitor 424, taken together, form a low-pass filter. The low-pass filter acts to reduce high frequency noise injection. Capacitor 424 also acts to block power supply noise injection. The RC time constant of the resistor and capacitor is discussed further below in connection with the rate at which the output of a comparator is sampled. In this illustrative embodiment, resistor 422 is formed as an n-well resistor, and capacitor 424 is formed as an n-channel field effect transistor (NFET) with its source and drain terminals electrically tied together. It will be appreciated that other structures can be used to form both resistors and capacitors, and the present invention is not limited to n-well resistors, or NFET capacitors.

Resistors 418 and 420 are coupled in series between a power supply node 406 and ground, so as to form a voltage divider. More particularly, resistor 418 is coupled between power supply node 406 and a node 434; and resistor 420 is coupled between node 434 and ground. Each resistor has an impedance that is equal to, or substantially equal to, the impedance of the other. In this way the voltage at node 434 is substantially equal to one half the voltage at node 406. In this illustrative embodiment, each of resistors 418 and 420 is implemented as a PFET with its gate terminal coupled to its drain terminal, and its body terminal coupled to its source terminal. Each of resistors 418 and 420 is preferably formed on integrated circuit 401 so as to have substantially identical physical layout. Each of resistors 418 and 420 has a resistance substantially equal to twice the resistance of resistor 422. A capacitor 426 is coupled between node 434 and ground. Capacitor 426 acts to block power supply noise injection. Capacitor 424 is formed as an n-channel field effect transistor (NFET) with its source and drain terminals electrically tied together. It will be appreciated that other structures can be used to form both resistors and capacitors, and the present invention is not limited to PFET resistors, or NFET capacitors.

Still referring to FIG. 4, it can be seen that a comparator 428 has two input terminals and an output terminal. A first input terminal of comparator 428 is coupled to node 432, and a second input terminal of comparator 428 is coupled to node 434. In this way, the voltage at node 432, which is a low pass filtered function of the ratio of impedance between reference termination device 410 and resistor 416, is compared to the voltage at node 434, which is substantially equal to one half the voltage at node 406.

A state machine 430 is coupled to the output terminal of comparator 428. State machine 430 is also coupled to receive a clock signal CLK. The preferred period of clock signal CLK is equal to or less than one half the RC time constant of resistor 422 and capacitor 424. The output of comparator 428 is sampled by state machine 430 in accordance with the period of clock signal CLK. State machine 430 generates an output that is coupled to reference termination device 410 through digital low-pass filter 436. If the output of comparator 428 indicates that the voltage at node 432 is higher than the voltage at node 434, then state machine 430 generates an output that causes the impedance of reference termination device 410 to increase. Similarly, if the output of comparator 428 indicates that the voltage at node 432 is lower than the voltage at node 434, then state machine 430 generates an output that causes the impedance of reference termination device 410 to decrease. Implementation of such state machines is well known in this field, and such blocks are often synthesized by computer software. Those skilled in the art will appreciate that actual gate level implementations may vary based on such factors as, for example, whether the state machine is to be constructed from gate arrays, standards cells, or full custom designed integrated circuit layout.

Still referring to FIG. 4, it can be seen that the output 408 of state machine 430 is coupled to a digital low-pass filter 436. The output generated by digital low-pass filter 436 is coupled to an impedance-controlled termination device 402. Since the voltages at nodes 432 and 434 might never match exactly, it is possible that state machine 430 will continually instruct reference termination device 410 increase and decrease its impedance. Digital low-pass filter 436 functions so as to receive the output generated by state machine 430 and to filter out rapid fluctuations in the output of state machine 430. In this way, impedance-controlled termination device 402 provides a relatively stable impedance value with which to terminate a transmission line.

Alternatively, digital low-pass filter may be coupled between comparator 428 and state machine 430. This may result in the impedance control signals, and therefore the impedance of the termination devices, oscillating around an ideal operating point even under steady state conditions. Such oscillations would be less than what would be expected in a circuit without the digital low-pass filter. However, such a configuration may be advantageous in that the low pass filter is simpler to implement when the digitally impedance-controlled devices 402, 410 have a relatively large number of control signal inputs. By placing digital low-pass filter 436 between comparator 428 and state machine 430, only one input signal is processed by the low-pass filter, i.e., the output of comparator 428. Whereas by placing digital low-pass filter 436 as shown in FIG. 4, it must process all the control signals generated by state machine 430, i.e., the wider datapath must be accommodated in the physical design of the integrated circuit.

In a further alternative embodiment of the present invention, the digital control signals sent to impedance-controlled devices 402, 410 may be passed through a series of latches between the source and destination of the control signals. Such a series of latches may be referred to in this field as pipeline latches. Although such pipelining introduces additional latency, this is not typically considered to be a disadvantage. Those skilled in the art will recognize the logical equivalence of coupling the impedance-controlled devices either directly to the source of their control signals, or through a series of latches.

Impedance-controlled termination device 402 is coupled to a node 404. An input buffer 418 is also coupled to node 404. As described in connection with the embodiment shown in FIG. 2, any suitable input buffer circuit configuration may be used in conjunction with termination devices in accordance with the present invention. The input buffer may be as simple as a logic gate, or may be very complex and include level shifters, latches, differential amplifiers, and/or multiple stages of buffering. The present invention is not limited to any particular input buffer configuration.

Figure 5:
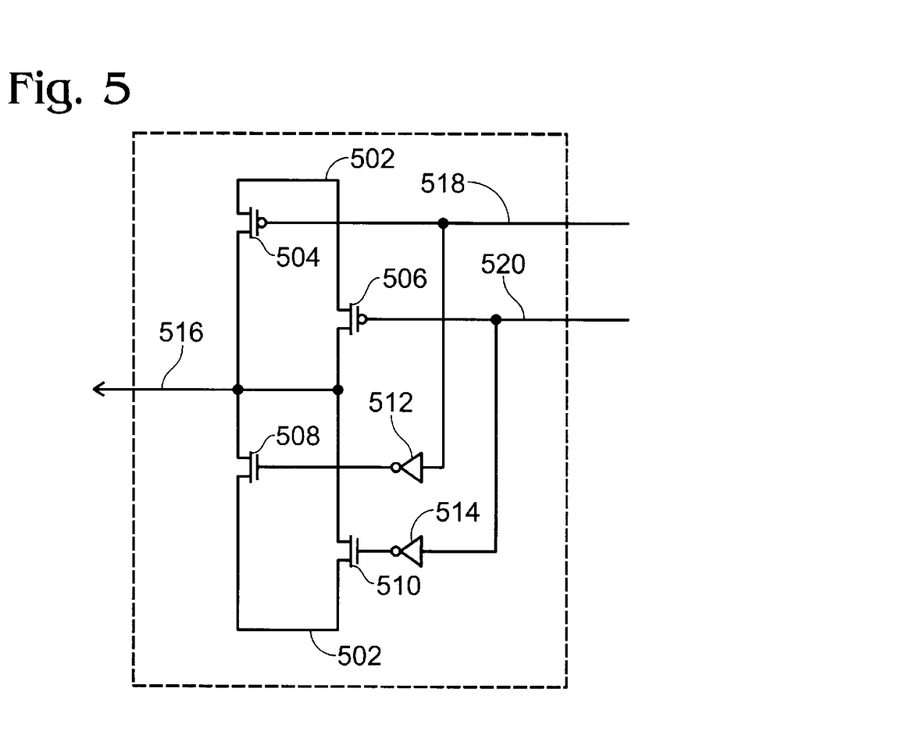
FIG. 5 is a transistor-level schematic diagram showing the on-chip, impedance-controlled termination device of FIG. 4.

FIG. 5 shows an illustrative implementation of the termination devices used in the embodiment of FIG. 4. In this illustrative implementation, PFETs and an equal number of NFETs are coupled in parallel between a power supply node and an output node. The NFETs and PFETs receive complementary control signals at their gate terminals so that NFET/PFET pairs switch on and off at substantially the same time. More particularly, a PFET 504 is coupled source-to-drain between a power supply node 502 and a node 516, and a PFET 506 is coupled source-to-drain between power supply node 502 and node 516. Similarly, an NFET 508 is coupled drain-to-source between power supply node 502 and node 516, and an NFET 510 is coupled drain-to-source between power supply node 502 and node 516. Two control signal nodes 518, 520 are coupled 25 to the gate terminals of PFETs 504 and 506 respectively. Control signal nodes 518, 520 are also coupled to the input terminals of inverters 512, 514 respectively. The output terminals of inverters 512, 514 are coupled to the gates of NFETs 508, 510 respectively. The termination device shown in FIG. 5, can be used as the both the reference termination device 410 and the impedance-controlled termination device 402, in the embodiment shown in FIG. 4.

Those skilled in the art and having the benefit of this disclosure will recognize that a larger number of transistor pairs can be used to provide for a finer granularity of impedance matching. For example, if five binary weighted pairs were used in the termination device of FIG. 5, then a selection of 31 different driving impedances would be available. The present invention is not limited in any way to a particular number, or type, of transistor.

In order to control, or reduce, power consumption, portions of the circuitry of the present invention may be shut down. More particularly, during a low power state, in an integrated circuit embodying the present invention, the impedance control loop is shut down to save power, while still maintaining the on die termination. The termination circuitry will thus stop tracking variations in voltage and temperature, but will continue to terminate (somewhat less effectively) the transmission lines. Since only a relatively small number of control signals, e.g., those used to exit the low power state, are typically active during the low power state, this is believed to be a reasonable trade-off. Those skilled in the art and having the benefit of this disclosure will recognize that other tradeoffs may be made during low power states.

Conclusion

Embodiments of the present invention provide on-chip, impedance-controlled termination devices for terminating transmission lines used for high speed signaling between integrated circuits.

An advantage of embodiments of the present invention is that a single external reference resistor can be used to set the impedance of a plurality of on-chip termination devices.

A further advantage of embodiments of the present invention is that, external termination resistors are not required for each bus line.

The present invention may be implemented with various changes and substitutions to the illustrated embodiments. For example, the present invention may be implemented with register programmable impedance control parameters. Another alternative, is where active devices other than PFETs, e.g., NFETs, are used as termination devices. A still further alternative uses an active circuit rather than a resistor to provide the reference impedance.

It will be readily understood by those skilled in the art that various other changes in the details, materials, and arrangements of the parts and steps which have been described and illustrated in order to explain the nature of this invention may be made without departing from the principles and scope of the invention as expressed in the subjoined claims.

What is claimed is:

1. A circuit comprising:
a first variable impedance device coupled between a first power supply node and a first node, the first variable impedance device having at least one control terminal;
a second variable impedance device coupled between the first power supply node and a second node, the second variable impedance device having at least one control terminal;
a resistive pathway coupled between the second node and ground; and
an impedance control circuit having an input terminal and at least one output terminal, the input terminal of the impedance control circuit coupled to the second node, and the at least one output terminal coupled to the corresponding control terminals of the first and second variable impedance devices and wherein the impedance control circuit comprises a comparator having at least two input terminals; a first voltage divider coupled to a first one of the comparator input terminals; and a state machine coupled to an output terminal of the comparator.

2. The circuit of claim 1, further comprising an input buffer coupled to the first node.

3. The circuit of claim 1, wherein the first variable impedance device comprises at least one PFET.

4. The circuit of claim 1, the second variable impedance device comprises at least one PFET.

5. The circuit of claim 1, wherein the first and second variable impedance devices both comprise field effect transistors.

6. The circuit of claim 1, wherein the resistive pathway comprises a resistor.

7. The circuit of claim 1, wherein the resistive pathway comprises an active circuit.

8. The circuit of claim 1 further comprising
a digital low-pass filter coupled to an output terminal of the comparator; and an output terminal of the digital low-pass filter further coupled to the state machine.

9. The circuit of claim 1, further comprising a digital low-pass filter coupled between the state machine and the first variable impedance device.

10. (Amended) A system, comprising:
at least one integrated circuit having a plurality of output drivers disposed therein;
a plurality of electrical conductors, external to the at least one integrated circuit, coupled respectively to the output drivers;
an integrated circuit having a plurality of variable-impedance termination devices coupled respectively to the plurality of electrical conductors, the variable-impedance termination devices each having a control input; and
an impedance control circuit having an output terminal coupled to the control input terminals of the plurality of variable-impedance termination devices;
wherein the impedance control circuit comprises a comparator having at least two input terminals; a first voltage divider coupled to a first one of the comparator input terminals; and a state machine coupled to an output terminal of the comparator.

11. The system of claim 10, further comprising a resistor, external to the integrated circuits, coupled to the impedance control circuit.

12. The system of claim 10, wherein each variable-impedance termination devices comprises at least one field effect transistor.

13. The system of claim 10, wherein at least one variable-impedance termination device comprises a PFET.

14. A system, comprising:
a first integrated circuit having a plurality of open drain drivers;
a plurality of bus lines coupled to the plurality of open drain drivers;
a second integrated circuit having a plurality of receiver circuits, the receiver circuits coupled to the plurality of bus lines; and a plurality of impedance-controlled termination devices;
wherein at least one impedance-controlled termination device is coupled to each of the bus lines and the at least one impedance-controlled termination device is coupled to an impedance control circuit comprising a comparator having at least two input terminals; a first voltage divider coupled to a first one of the comparator input terminals; and a state machine coupled to an output terminal of the comparator.

15. The system of claim 14, wherein the impedance-controlled termination devices comprise pairs of binary weighted PFETs and NFETs.

16. A method of providing termination for transmission lines, comprising:
adjusting the impedance of a plurality of variable-impedance termination devices on a first integrated circuit, based at least in part on the value of a resistive pathway external to the first integrated circuit; and adjusting the impedance of a plurality of variable-impedance termination devices on a first integrated circuit, based at least in part on variations in temperature, manufacturing tolerances, and power supply voltage.

17. The method of claim 16, wherein the resistive pathway comprises a resistor.

18. A method of providing termination for transmission lines, comprising:

operating a state machine, on a first integrated circuit, to produce at least one control signal indicative of whether to increase or decrease the impedance of a reference impedance termination device based, at least in part, on the value of a resistive pathway; and adjusting the impedance of a plurality of variable-impedance termination devices on the first integrated circuit.

19. A method of communicating information between at least two integrated circuits coupled by a bus, the method comprising:

operating a state machine, on a first integrated circuit, to produce at least one control signal indicative of whether to increase or decrease the impedance of a reference impedance termination device based, at least in part, on the value of a resistive pathway external to the first integrated circuit; and adjusting the impedance of a plurality of variable-impedance termination devices on the first integrated circuit; and transmitting information from a second integrated circuit to the first integrated circuit over the bus.

20. The method of claim 18, wherein the resistive pathway comprises a resistor.

* * * * *

UNITED STATES PATENT AND TRADEMARK OFFICE
CERTIFICATE OF CORRECTION

PATENT NO. : 6,157,206
DATED : December 5, 2000
INVENTOR(S) : Taylor et al.

It is certified that error appears in the above-identified patent and that said Letters Patent is hereby corrected as shown below:

Column 8,
Line 48, after "coupled", delete "25".

Signed and Sealed this

Twenty-second Day of October, 2002

Attest:

Attesting Officer

JAMES E. ROGAN
Director of the United States Patent and Trademark Office

UNITED STATES PATENT AND TRADEMARK OFFICE
CERTIFICATE OF CORRECTION

PATENT NO. : 6,157,206
DATED : December 2, 2000
INVENTOR(S) : Taylor et al.

It is certified that error appears in the above-identified patent and that said Letters Patent is hereby corrected as shown below:

Column 10,
Lines 61-66, delete
"16. A method of providing termination for transmission lines, comprising:
adjusting the impedance of a plurality of variable-impedance termination devices on a first integrated circuit, based at least in part on the value of a resistive pathway external to the first integrated circuit; and"

Column 11,
Lines 1-5, delete
"adjusting the impedance of a plurality of variable-impedance termination devices on a first integrated circuit, based at least in part on variations in temperature, manufacturing, tolerances, and power supply coltage."

Line 6, delete "of claim 16" and insert -- of claim 18 --.

Signed and Sealed this

Twenty-second Day of February, 2005

JON W. DUDAS
*Director of the United States Patent and Trademark Office*